(12) United States Patent
Kim et al.

(10) Patent No.: US 7,408,817 B2
(45) Date of Patent: Aug. 5, 2008

(54) VOLTAGE GENERATING CIRCUIT, SEMICONDUCTOR MEMORY DEVICE COMPRISING THE SAME, AND VOLTAGE GENERATING METHOD

(75) Inventors: Jun-Hyung Kim, Suwon-si (KR); Won-Il Bae, Seongnam-si (KR); Seong-Jin Jang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/453,518

(22) Filed: Jun. 15, 2006

(65) Prior Publication Data
US 2007/0025164 A1    Feb. 1, 2007

(30) Foreign Application Priority Data
Jul. 28, 2005  (KR) ............... 10-2005-0068996

(51) Int. Cl.
*G11C 5/14* (2006.01)
(52) U.S. Cl. ............... 365/189.09; 365/226; 365/203
(58) Field of Classification Search ........... 365/203, 365/226, 189.09
See application file for complete search history.

(56) References Cited

U.S. PATENT DOCUMENTS

| | | | | | |
|---|---|---|---|---|---|
| 5,510,749 | A | * | 4/1996 | Arimoto | 327/546 |
| 5,673,229 | A | * | 9/1997 | Okamura et al. | 365/201 |
| 5,687,128 | A | * | 11/1997 | Lee et al. | 365/226 |
| 6,031,779 | A | * | 2/2000 | Takahashi et al. | 365/226 |
| 6,191,963 | B1 | * | 2/2001 | McPartland et al. | 327/536 |
| 6,967,523 | B2 | * | 11/2005 | DeMone | 327/537 |

FOREIGN PATENT DOCUMENTS

| | | |
|---|---|---|
| JP | 2002-157885 | 5/2002 |
| JP | 2003-259626 | 9/2003 |
| KR | 100172380 B1 | 10/1998 |

* cited by examiner

*Primary Examiner*—Thong Q Le
(74) *Attorney, Agent, or Firm*—F. Chau & Associates, LLC

(57) ABSTRACT

A voltage generating circuit for a semiconductor memory device. The voltage generating circuit includes a multi-boosting unit for stepping up a power supply voltage, a transfer transistor connected to a final boosting node of the multi-boosting unit and an output node, and a charge-sharing element, electrically connected to the final boosting node and a gate node of the transfer transistor, enabled during at least a part of the period the power supply voltage is stepped-up by the multi-boosting unit and performing charge sharing between the final boosting node and the gate node of the transfer transistor.

19 Claims, 6 Drawing Sheets

VOLTAGE GENERATING CIRCUIT, SEMICONDUCTOR MEMORY DEVICE COMPRISING THE SAME, AND VOLTAGE GENERATING METHOD

CROSS-REFERENCE TO RELATED PATENT APPLICATION

This application claims priority to Korean Patent Application No. 2005-0068996, filed on Jul. 28, 2005, in the Korean Intellectual Property Office, the disclosure of which is incorporated by reference herein.

BACKGROUND OF THE INVENTION

1. Technical Field

The present disclosure relates to a voltage generating circuit, a semiconductor memory device comprising the same, and a voltage generating method. More particularly, the present invention relates to a voltage generating circuit, a semiconductor memory device comprising the same, and a voltage generating method, which can efficiently drive low voltages.

2. Discussion of the Related Art

Semiconductor memory devices utilize a voltage generating circuit according to the operational needs of their internal circuits. In particular, a boosted voltage (Vpp), which is higher than a power supply voltage (Vcc), is generally utilized in semiconductor memory devices to compensate for threshold voltage (Vth) loss of MOS transistors.

The boosted voltage Vpp is utilized in circuits such as word-line driver circuits, bit-line isolation circuits, data output buffer circuits, etc. In these types of circuits, Vpp must be higher than Vcc+Vth. In particular, the word-line driver circuits require Vpp to be much higher than Vcc+Vth.

While there are various methods of generating Vpp, a bootstrapping technique which does not require a large amount of power and can be utilized at high speeds is most commonly used. The bootstrapping technique generates Vpp by time-dependent repetition of precharging, boosting, and charge sharing.

Conventional voltage generating circuits include a transfer transistor, which outputs a several times boosted voltage from a boosting node. However, when the boosted voltage at the boosting node is output, the voltage level at a gate node of a transfer transistor is smaller than the boosted voltage level at the boosting node, which makes it difficult to maximize the transfer characteristics of the transfer transistor. This phenomenon becomes worse as Vcc decreases or as a target Vpp increases, thereby significantly reducing voltage generation efficiency. Therefore, there exists a need to improve the low-voltage driving efficiency of voltage generating circuits for semiconductor memory devices.

SUMMARY OF THE INVENTION

According to an exemplary embodiment of the present invention, there is provided a voltage generating circuit for a semiconductor memory device. The voltage generating circuit includes a multi-boosting unit, a transfer transistor, and a charge-sharing element. The multi-boosting unit is for stepping up a power supply voltage. The transfer transistor is electrically connected to a final boosting node of the multi-boosting unit and an output node. The charge-sharing element is electrically connected to the final boosting node and a gate node of the transfer transistor, and is enabled during at least a part of a period the power supply voltage is stepped-up by the multi-boosting unit. The charge-sharing element also performs charge sharing between the final boosting node and the gate node of the transfer transistor.

According to an exemplary embodiment of the present invention, there is provided a voltage generating method for a semiconductor memory device. The semiconductor memory device of the method includes a multi-boosting unit, a transfer transistor electrically connected to a final boosting node of the multi-boosting unit and an output node, and a charge-sharing element electrically connected to the final boosting node and a gate node of the transfer transistor. The method includes the steps of using the multi-boosting unit to step-up a power supply voltage during a first period, enabling the charge-sharing element during at least a part of the first period, and using the enabled charge-sharing element to perform charge sharing between the final boosting node and the gate node of the transfer transistor during at least a part of the first period.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Hereinafter, exemplary embodiments of the present invention will be described in detail with reference to the attached drawings. Like reference numerals in the drawings denote like elements.

Figure 1:
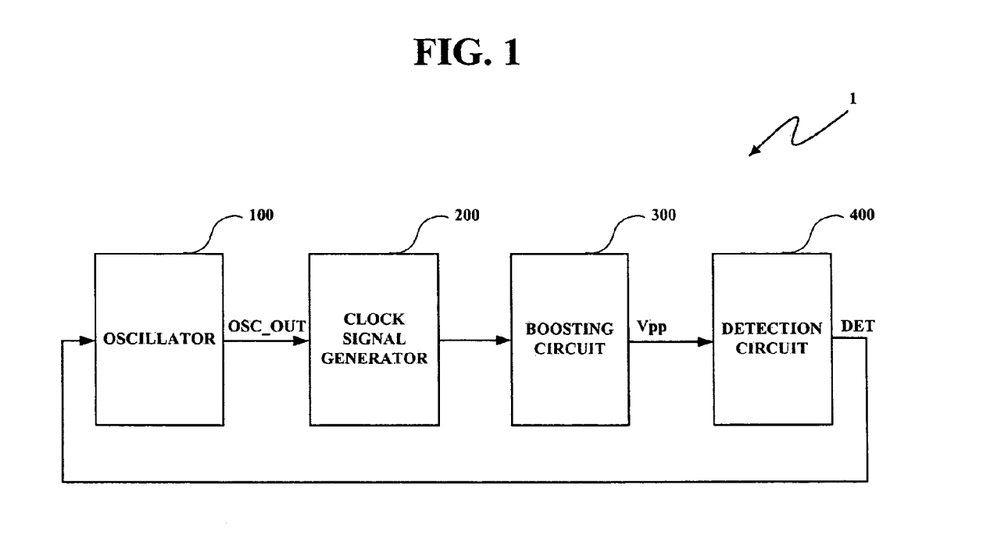
FIG. 1 is a block diagram illustrating a voltage generating circuit for a semiconductor memory device according to an exemplary embodiment of the present invention.

FIG. 1 is a block diagram illustrating a voltage generating circuit 1 for a semiconductor memory device according to an exemplary embodiment of the present invention.

Referring to FIG. 1, the voltage generating circuit includes an oscillator 100, a clock signal generator 200, a boosting circuit 300, and a detection circuit 400.

The oscillator 100 generates an oscillator output signal OSC_OUT for triggering the operation of the clock signal generator 200, in response to a detection signal DET. The oscillator 100 may be implemented by a ring oscillator.

In response to the oscillator output signal OSC_OUT, the clock signal generator 200 generates signals for controlling the operation of the boosting circuit 300. The signals may include multiple boosting signals CK1, CK2, and CK3, multiple pre-charge signals PCG1, and PCG2, multiple charge-sharing signals SHR1, and SHR2, a control signal CTR, an output signal OUT or combinations thereof.

In response to the signals, the boosting circuit 300 performs repeated voltage-boosting operations and outputs a boosted voltage Vpp. The repeated voltage-boosting operations allow a boosting capacitor to be reduced in size and the boosted voltage Vpp to be adjusted to a predetermined voltage level.

The boosting circuit 300 includes a transfer transistor that outputs a stepped-up voltage at a boosting node. In an exemplary embodiment of the present invention, a charge-sharing element is electrically connected to the boosting node and a gate node of the transfer transistor. The charge-sharing element is responsible for charge sharing between the boosting node and the gate node of the transfer transistor during at least a part of the period the voltage is stepped-up. When the voltage at the boosting node is output, the voltage level at the gate node of the transfer transistor can be sufficiently increased, thereby increasing transfer efficiency.

The detection circuit 400 detects if the boosted voltage Vpp from the boosting circuit 300 reaches a target level. If the boosted voltage Vpp reaches a target level, the detection circuit 400 outputs a low-level detection signal that causes the oscillator 100 to stop operating. However, if the boosted voltage Vpp is below the target level, the detection circuit 400 outputs a high-level detection signal that causes the oscillator 100 to resume operating. A boosted voltage higher than the target level uses additional power and causes added stress to semiconductor memory devices, and a boosted voltage lower than the target level results in a degradation of transistors.

Figure 2:
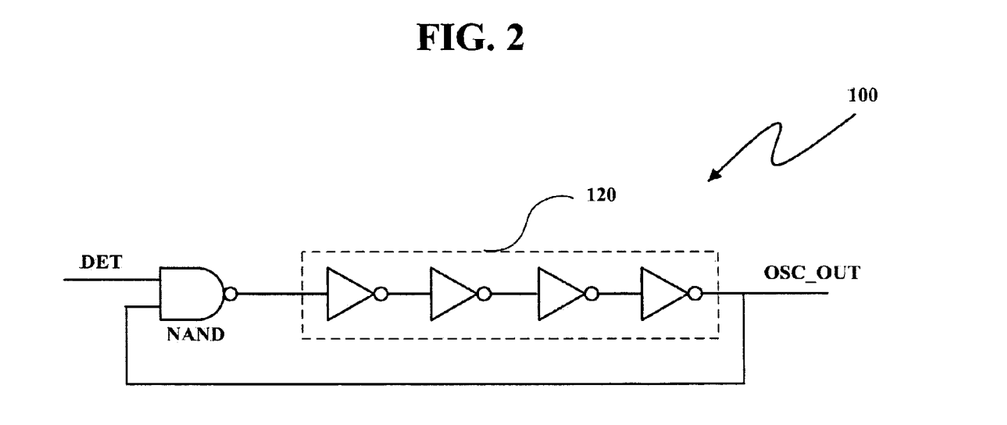
FIG. 2 is a circuit diagram illustrating an exemplary embodiment of the oscillator of the voltage generating circuit of FIG. 1.

FIG. 2 is a circuit diagram illustrating an exemplary embodiment of the oscillator 100 of the voltage generating circuit of FIG. 1.

Referring to FIG. 2, the oscillator 100 includes a NAND gate NAND and an inverter chain 120.

The NAND gate NAND receives the detection signal DET fed back from the detection circuit 400. The inverter chain 120 includes a plurality of serially-connected inverters. The inverter chain 120 receives an output signal from the NAND gate NAND and then outputs the oscillator output signal OSC_OUT.

If the detection signal DET is at a high level, the oscillator 100 starts operating upon receipt of the detection signal DET and generates the oscillator output signal OSC_OUT at a predetermined frequency. However, if the detection signal DET is at a low level, the oscillator 100 stops operating.

Figure 3:
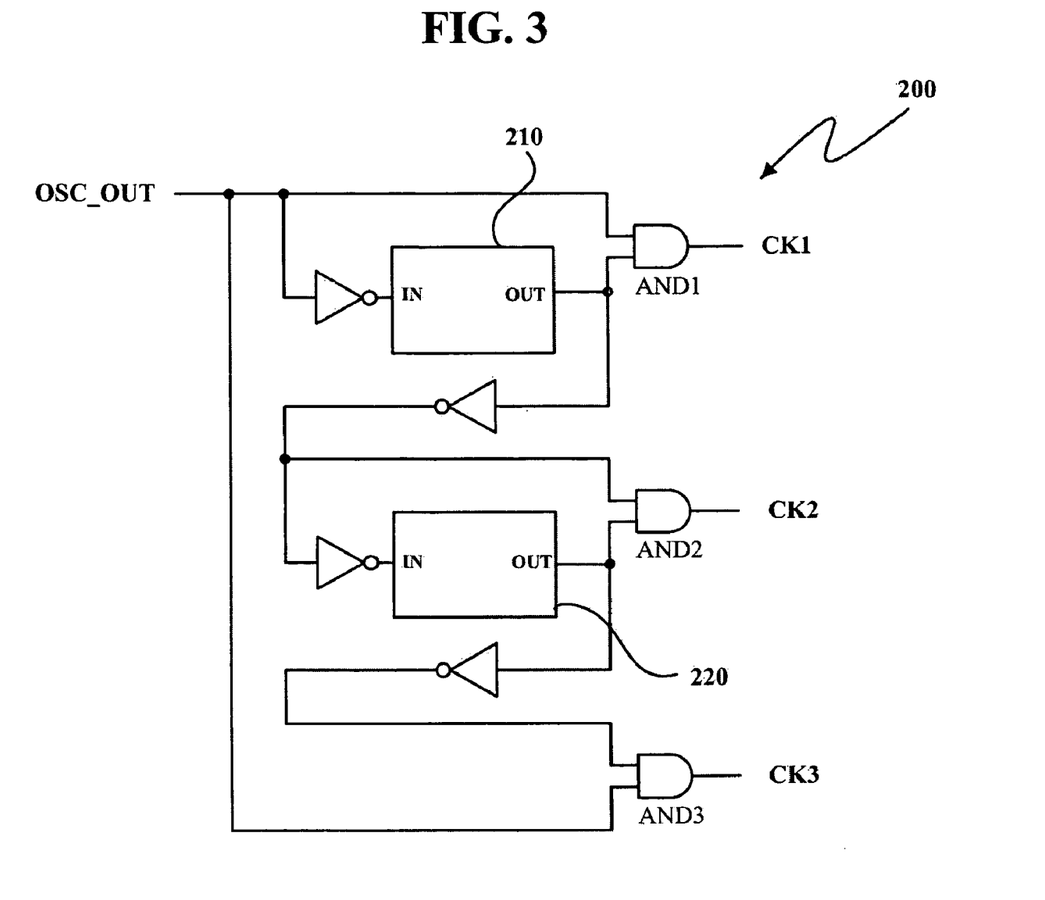
FIG. 3 is a circuit diagram illustrating an exemplary embodiment of the clock signal generator of the voltage generating circuit of FIG. 1.

FIG. 3 is a circuit diagram illustrating an exemplary embodiment of the clock signal generator 200 shown in FIG. 1. The circuit provides multiple boosting signals CK1, CK2, and CK3. Clock signals other than the boosting signals CK1, CK2, and CK3 will be understood by those of ordinary skill in the art from a timing diagram of FIG. 5.

Referring to FIG. 3, the clock signal generator 200 includes first and second delay elements 210 and 220, and multiple AND gates AND1, AND2, and AND3.

The clock signal generator 200 receives the oscillator output signal OSC_OUT and then outputs the multiple boosting signals CK1, CK2, and CK3. With respect to the generation of the boosting signal CK1, if the oscillator output signal OSC_OUT is a logic "low", an output signal at an output node of the first delay element 210 is a logic "high" and the boosting signal CK1 is a logic "low". When the oscillator output signal OSC_OUT transitions "high", the boosting signal CK1 transitions "high". However, after a predetermined time delay, when the output signal at the output node of the first delay element 210 transitions "low", the boosting signal CK1 transitions back to a logic "low". Through this procedure, the boosting signal CK1 can be generated with a predetermined pulse width.

The boosting signals CK2 and CK3 can also be generated using a procedure similar to that described above with regard to the boosting signal CK1.

Figure 4:
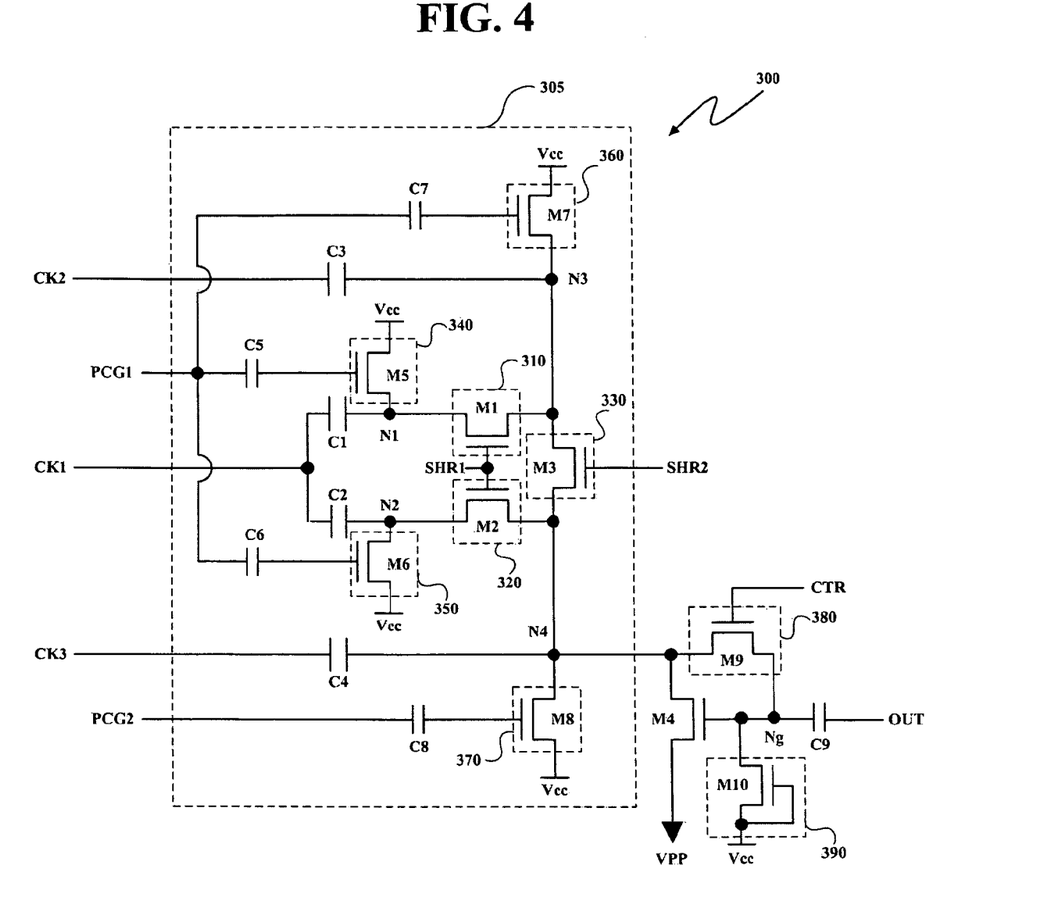
FIG. 4 is a circuit diagram illustrating an exemplary embodiment of the boosting circuit of the voltage generating circuit of FIG. 1.
Figure 5:
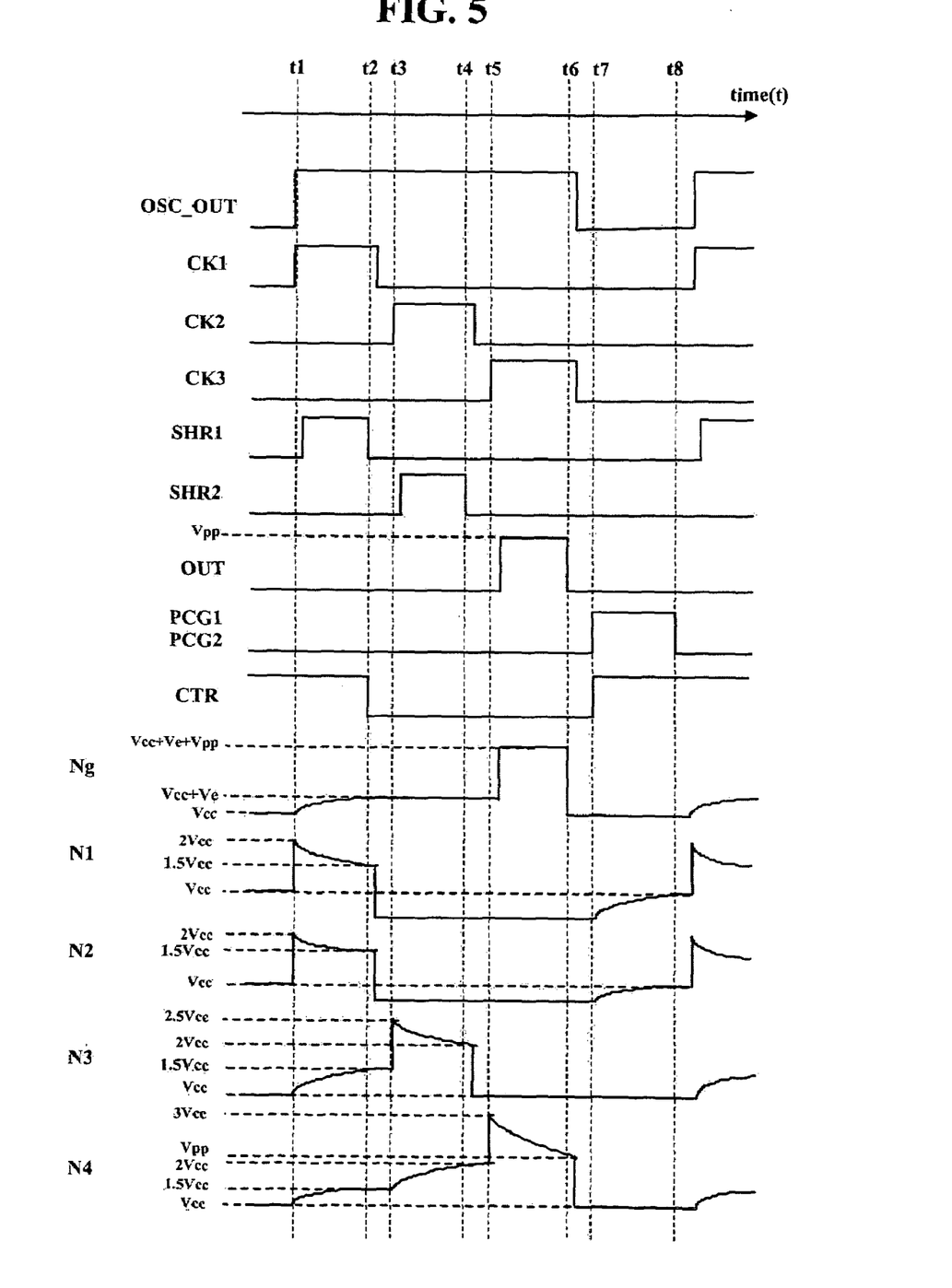
FIG. 5 is a timing diagram of the boosting circuit of FIG. 4.

FIG. 4 is a circuit diagram illustrating an exemplary embodiment of the boosting circuit 300 of the voltage generating circuit 1 shown in FIG. 1. FIG. 5 is a timing diagram of the boosting circuit shown in FIG. 4. While the boosting circuit of the voltage generating circuit for a semiconductor memory device according to an exemplary embodiment of the present invention has been described in terms of a three-step boosting unit, the invention is not limited to this illustration.

Referring to FIG. 4, the boosting circuit 300 includes a multi-boosting unit 305 for stepping up a power supply voltage. The multi-boosting unit 305 includes first through fourth boosting nodes N1, N2, N3, and N4, first through fourth boosting capacitors C1, C2, C3, and C4, first through third charge-sharing elements 310, 320, and 330, first through fourth pre-charge elements 340, 350, 360, and 370, and fifth through eighth boosting capacitors C5, C6, C7, and C8. The boosting circuit 300 also includes a transfer transistor M4, a fourth charge-sharing element 380, an output boosting capacitor C9, and a fifth pre-charge element 390 to output a boosted voltage from the multi-boosting unit 305.

The multi-boosting unit 305 includes the first through fourth boosting nodes N1, N2, N3, and N4 for stepping up the power supply voltage. The fourth boosting node N4 is a final boosting node, and a final boosted voltage at the fourth boosting node N4 is output to an output node. The first through fourth boosting nodes N1, N2, N3, and N4 are respectively electrically connected to the first through fourth boosting capacitors C1, C2, C3, and C4, and the first through fourth boosting capacitors C1, C2, C3, and C4 pump charges to the first through fourth boosting nodes N1, N2, N3, and N4 in response to first through third boosting signals CK1, CK2, and CK3.

The first through third charge-sharing elements 310, 320, and 330 are electrically connected to the first through fourth boosting nodes N1, N2, N3, and N4 to share charges at the first through fourth boosting nodes N1, N2, N3, and N4. While FIG. 4 illustrates that the first through third charge-sharing elements 310, 320, and 330 include first through third NMOS transistors M1, M2, and M3, respectively, the present invention is not limited thereto. The first charge-sharing element 310 is electrically connected to the first boosting node N1 and the third boosting node N3, and is enabled in response to a first charge-sharing signal SHR1. The second charge-sharing element 320 is electrically connected to the second boosting node N2 and the fourth boosting node N4, and is enabled in response to the first charge-sharing signal SHR1. The third charge-sharing element 330 is electrically connected to the third boosting node N3 and the fourth boosting node N4, and is enabled in response to a second charge-sharing signal SHR2.

In addition, the first through fourth pre-charge elements 340, 350, 360, and 370 are responsible for pre-charging the first through fourth boosting nodes N1, N2, N3, and N4 before or after boosting operation occurs at the first through fourth boosting nodes N1, N2, N3, and N4. In FIG. 4, the first through fourth pre-charge elements 340, 350, 360, and 370 are electrically connected to a power supply voltage Vcc and the first through fourth boosting nodes N1, N2, N3, and N4, and include fifth through eighth NMOS transistors M5, M6, M7, and M8 which are enabled in response to a first pre-charge signal PCG1 or a second pre-charge signal PCG2, but the present invention is not limited thereto. The fifth through eighth boosting capacitors C5, C6, C7, and C8 are respectively electrically connected to gate nodes of the fifth through eighth NMOS transistors M5, M6, M7, and M8, and pump charges to the fifth through eighth NMOS transistors M5, M6, M7, and M8 in response to the first pre-charge signal PCG1 or the second pre-charge signal PCG2, thereby increasing the transfer efficiency of the power supply voltage Vcc at the fifth through eighth NMOS transistors M5, M6, M7, and M8. Although not shown, separate diodes may be provided to prevent the floating of the gate nodes of the fifth through eighth NMOS transistors M5, M6, M7, and M8. Diodes may have anodes electrically connected to the power supply voltage Vcc and cathodes electrically connected to the gate nodes of the fifth through eighth NMOS transistors M5, M6, M7, and M8 so that the gate nodes can be maintained at the voltage level of the power supply voltage Vcc.

The transfer transistor M4 is electrically connected to the fourth boosting node N4 and the output node, and outputs the final boosted voltage at the fourth boosting node N4 in response to an output signal OUT. The output signal OUT may have a boosted voltage level Vpp, thereby increasing the transfer efficiency of the final boosted voltage. The output boosting capacitor C9 is electrically connected to a gate node Ng of the transfer transistor M4 and an input terminal of the output signal OUT to pump charges to the gate node Ng in response to the output signal OUT.

The fourth charge-sharing element 380 is electrically connected to the fourth boosting node N4 and the gate node Ng of the transfer transistor M4, and is enabled during at least a part of the period the power supply voltage is stepped-up. For example, the fourth charge-sharing element 380 may be enabled during a first boosting period, i.e., the period during which a boosting operation occurs at the second boosting node N2, or during a second boosting period, i.e., the period during which a boosting operation occurs at the third boosting node N3.

In addition, the fourth charge-sharing element 380 may be an NMOS transistor M9 which is turned-on in response to a control signal CTR, which is enabled during at least a part of the period the power supply voltage is stepped-up. The fourth charge-sharing element 380 may be turned-on during pre-charging of the first through fourth boosting nodes N1, N2, N3, and N4 after stepping up the power supply voltage.

When the fourth charge-sharing element 380 performs charge sharing between the gate node Ng of the transfer transistor M4 and the first through fourth boosting nodes N1, N2, N3, and N4 during at least a part of the period the power supply voltage is stepped-up, the voltage level at the gate node Ng of the transfer transistor M4 can be sufficiently increased when the voltage at the fourth boosting node N4 is output. Therefore, the transfer efficiency of the voltage at the fourth boosting node N4 can be improved.

The fifth pre-charge element 390 prevents the voltage level at the gate node Ng from dropping to less than the power supply voltage Vcc during a pre-charge period, and prevents the floating of the gate node Ng.

Hereinafter, the operation of an exemplary boosting circuit of a voltage generating circuit for a semiconductor memory device according to an exemplary embodiment of the present invention will be described with reference to FIGS. 4 and 5.

Assumptions are made that the first through eighth boosting capacitors M1, M2, M3, M4, M5, M6, M7, and M8 are pre-charged to Vcc and the first through fourth boosting nodes N1, N2, N3, and N4 are also pre-charged to Vcc. Referring to FIG. 4, the first through fourth boosting capacitors C1, C2, C3, and C4 are ideal capacitors having the same capacitance, respectively.

At a time t1, when an oscillator output signal OSC_OUT transitions "high", a clock signal generator (see 200 of FIG. 1) supplies a first boosting signal CK1.

Accordingly, the first and second boosting capacitors C1 and C2 pump charges to the first and second boosting nodes N1 and N2, and the first and second boosting nodes N1 and N2 are boosted to 2 times Vcc. The first charge-sharing signal SHR1 transitions "high" based on the first boosting signal CK1, thereby enabling the second charge-sharing element 320. Since the control signal CTR is also a logic "high", the fourth charge-sharing element 380 is in an enabled state. Therefore, the first boosting node N1 shares charges with the third boosting node N3, and the second boosting node N2 shares charges with the fourth boosting node N4 and the gate node Ng. When the second boosting node N2 shares charges with the gate node Ng as well as the fourth boosting node N4, the voltage level at the fourth boosting node N4 does not drop significantly.

A voltage increment of the fourth boosting node N4 and a voltage increment of the gate node Ng may be expressed as Equation 1 below:

$$Vr = \frac{C2}{C2 + C9} * Vo \qquad (1)$$

$$Ve = \frac{C9}{C2 + C9} * Vo$$

Referring to Equation 1, Vo is a voltage increment of the fourth boosting node N4 when the fourth charge-sharing element 380 is not enabled, and thus the second boosting node N2 shares charges with only the fourth boosting node N4. Vr is a voltage increment of the fourth boosting node N4 when the fourth charge-sharing element 380 is enabled, and thus the second boosting node N2 shares charges with the fourth boosting node N4 and the gate node Ng. Ve is a voltage increment of the gate node Ng when the fourth charge-sharing element 380 is enabled, and thus the second boosting node N2 shares charges with the fourth boosting node N4 and the gate node Ng.

As an example, if the capacitance of the second boosting capacitor C2 is nine times higher than that of the output boosting capacitor C9, about 90% of Vo is subjected to charge sharing. Thus, if the capacitance of the second boosting capacitor C2 is much higher than that of the output boosting capacitor C9, Vr equals Vo. In an exemplary embodiment of the invention, the capacitance of the second boosting capacitor C2 is generally ten times greater than that of the output boosting capacitor C9, so the values of Vr and Vo make little difference.

For convenience of illustration, an exemplary embodiment of the present invention will be described hereinafter on the assumption that the capacitance of the second boosting capacitor C2 is much higher than that of the output boosting capacitor C9, and thus, the fourth boosting node N4 is not affected by charge sharing between the second boosting node N2, and the fourth boosting node N4 and the gate node Ng, and a voltage increment Ve is achieved at the gate node Ng.

A charge sharing period is determined by the capacitances of the first and second boosting capacitors C1 and C2, the output boosting capacitor C9, and the resistances of the first and second NMOS transistors M1 and M2.

At a time t2, the first charge-sharing signal SHR1 and the control signal CTR are transitioned to a logic "low". The first boosting signal CK1 is also transitioned to a logic "low" thereafter.

When the charge sharing is terminated, the first through fourth boosting nodes N1, N2, N3, and N4 are adjusted to 1.5 times Vcc, and the gate node Ng is adjusted to Vcc+Ve.

At a time t3, when the second boosting signal CK2 transitions "high" (second boosting), the third boosting capacitor C3 pumps charges to the third boosting node N3, and thus, the third boosting node N3 is boosted to 2.5 times Vcc. The second charge-sharing signal SHR2 transitions "high" based on the second boosting signal CK2, and the third boosting node N3 and the fourth boosting node N4 begin to share charges.

At a time t4, the second charge-sharing signal SHR2 transitions "low", and then the second boosting signal CK2 transitions "low".

When the charge sharing is terminated, the third boosting node N3 and the fourth boosting node N4 are adjusted to 2 times Vcc.

At a time t5, when the third boosting signal CK3 transitions "high" (third boosting), the fourth boosting capacitor C4 pumps charges to the fourth boosting node N4, and thus, the fourth boosting node N4 is boosted to 3 times Vcc.

The output signal OUT transitions "high" based on the third boosting signal CK3. The output signal OUT is a signal swinging between the ground voltage and the boosted voltage level Vpp. The voltage level at the gate node Ng is adjusted to Vcc+Ve by the first boosting, and the gate node Ng is adjusted to Vcc+Ve+Vpp in response to the output signal OUT. The voltage increment Ve is produced at the gate node Ng as compared to a conventional voltage generating circuit wherein there is no charge sharing between a boosting node and a gate node during stepping up of the power supply voltage.

Therefore, when the voltage at the fourth boosting node N4 is output, the voltage level at the gate node Ng of the transfer transistor M4 can be sufficiently increased. The transfer transistor M4 can increase the transfer efficiency of the voltage at the fourth boosting node N4 to the output node.

At a time t6, the output signal OUT transitions "low". When the voltage transfer to the output node is terminated, the fourth boosting node N4 is adjusted to Vpp, Thereafter, the third boosting signal CK3 transitions "low".

At a time t7, the first and second pre-charge signals PCG1 and PCG2, and the control signal CTR are transitioned to a logic "high". When the first through fourth boosting nodes N1, N2, N3, and N4 are pre-charged to Vcc, the fourth charge-sharing element 380 is enabled, and thus, the gate node Ng is also pre-charged to Vcc. The fifth pre-charge element 390 prevents the voltage level at the gate node Ng from dropping to less than Vcc.

At a time t8, when the first and second pre-charge signals PCG1 and PCG2 transition "low", pre-charging is terminated, and the first through fourth boosting nodes N1, N2, N3, and N4 are adjusted to Vcc, thereby completing one cycle of a three-step boosting.

The control signal CTR can be maintained at a high state until the first boosting period (t1-t2) is terminated. When the gate node Ng is adjusted to Vcc+Ve during the first boosting period, the voltage level at the gate node Ng electrically connected to a cathode is higher than the voltage level of the power supply node electrically connected to an anode, which causes the fifth pre-charge element 390 to stop operating.

While the above described exemplary embodiment of the present invention illustrated that all the boosting nodes N1, N2, N3, and N4 are pre-charged after the boosting operation is completed, the present invention is not limited thereto. For example, after the first boosting operation occurs at the first and second boosting nodes N1 and N2, the first and second boosting nodes N1 and N2 may be pre-charged while the second boosting operation occurs at the third boosting node N3.

Figure 6:
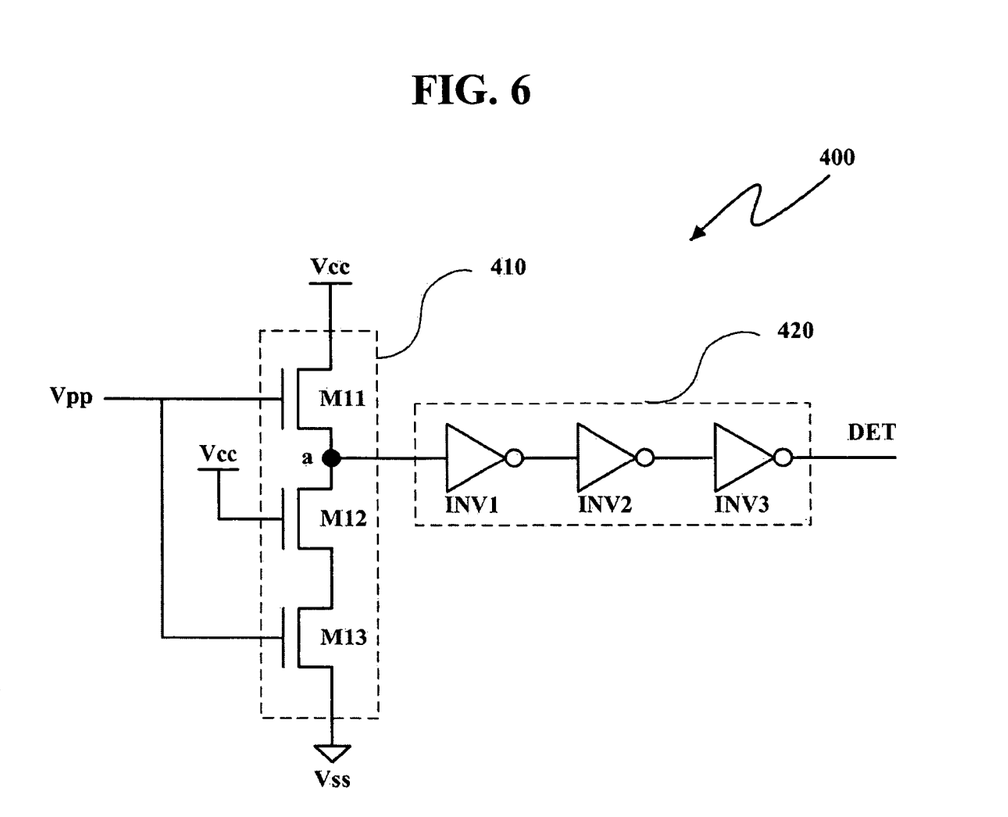
FIG. 6 is a circuit diagram illustrating an exemplary embodiment of the detection circuit of the voltage generating circuit of FIG. 1.

FIG. 6 is a circuit diagram of an exemplary embodiment of the detection circuit 400 of the voltage generating circuit 1 of FIG. 1.

Referring to FIG. 6, the detection circuit 400 includes a comparative voltage generator 410 and a detection signal generator 420.

The comparative voltage generator 410 includes a plurality of NMOS transistors M1, M12, and M13 which are electrically connected in series to a power supply voltage Vcc and a ground voltage Vss. Gates of the NMOS transistors M11 and M13 are electrically connected to the boosted voltage Vpp from a boosting circuit (see 300 of FIG. 1), and a gate of the NMOS transistor M12 is electrically connected to the power supply voltage Vcc.

The detection signal generator 420 includes a plurality of serially connected inverters INV1, INV2, and INV3. The input of the detection signal generator 420 is electrically connected to a node a.

Assuming that the equivalent resistances of the NMOS transistor M11, M12, and M13 are R1, R2, R3, respectively, the voltage level of the node a is Va, which can be represented by Equation 2 below:

$$Va = \frac{R2 + R3}{R1 + R2 + R3} * Vcc \quad (2)$$

Referring to equation 2, the power supply voltage Vcc is a constant value. As the boosted voltage Vpp increases, R1 and R3 are reduced while R2 experiences little change. As the boosted voltage Vpp increases, the voltage level of Va increases.

For example, if the level of Va is higher than the logic threshold voltage of the inverter INV1, a detection signal DET, which is an output signal of the inverter INV1, transitions "low". The detection signal DET is fed back to an oscillator (see 100 of FIG. 1), thereby turning off the oscillator. The logic threshold voltage differs from the intrinsic threshold voltage of a transistor, and is determined by the W/L (Width/Length) ratio of a PMOS or NMOS type inverter. An inverter begins to change its output state around the logic threshold voltage. If the level of Va is lower than the logic threshold voltage of the inverter INV1, the detection signal DET, which is the output signal of the inverter INV1, transitions "high".

Figure 7:
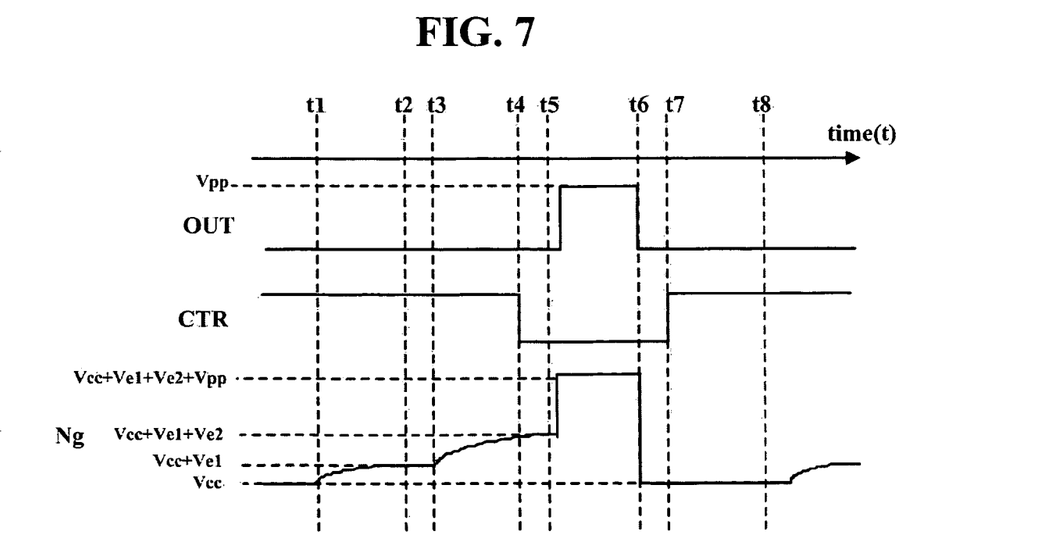
FIG. 7 is a timing diagram illustrating the operation of a boosting circuit of a voltage generating circuit for a semiconductor memory device according to an exemplary embodiment of the present invention.

FIG. 7 is a timing diagram illustrating the operation of a boosting circuit of a voltage generating circuit for a semiconductor memory device according to an exemplary embodiment of the present invention.

Referring to FIGS. 4 and 7, the control signal CTR transitions "low" not when the first boosting period is terminated, but when the second boosting period is terminated. When the voltage increment (see Ve of FIG. 5) of the gate node Ng is insufficient, the gate node Ng can share charges with the fourth boosting node N4 during the second boosting period. The gate node Ng may have a much higher voltage level during the second boosting period as compared to when it is subjected to charge sharing during the first boosting period. As shown in FIG. 7, a voltage increment produced by charge sharing during the first boosting period and a voltage increment produced by charge sharing during the second boosting are respectively expressed as Ve1 and Ve2. The gate node Ng is adjusted to Vcc+Ve1+Ve2+Vpp in response to the output signal OUT.

Figure 8:
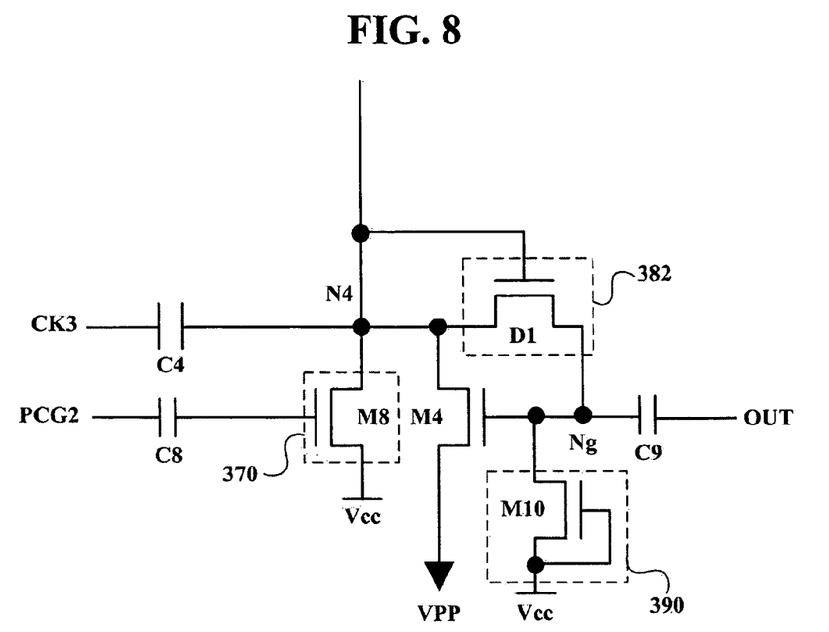
FIG. 8 is a circuit diagram illustrating a boosting circuit of a voltage generating circuit for a semiconductor memory device according to an exemplary embodiment of the present invention.

FIG. 8 is a circuit diagram illustrating a boosting circuit of a voltage generating circuit for a semiconductor memory device according to an exemplary embodiment of the present invention.

Referring to FIG. 8, a fourth charge-sharing element 382 may be implemented by a diode D1. The fourth charge-sharing element 382 has an anode electrically connected to a boosting node N4 and a cathode electrically connected to a gate node Ng. The fourth charge-sharing element 382 is enabled during the entire period the power supply voltage is stepped-up, unlike the forth charge-sharing element 380 of FIG. 4, which is enabled during at least a part of the period the power supply voltage is stepped-up. According to the exemplary embodiment of the present invention in FIG. 8, the voltage level of the fourth boosting node N4 and the voltage level of the gate node Ng may increase at substantially the same time. Therefore, the gate node Ng of FIG. 8 may have a voltage level much higher than the voltage level of the gate node NG of FIG. 4.

Figure 9:
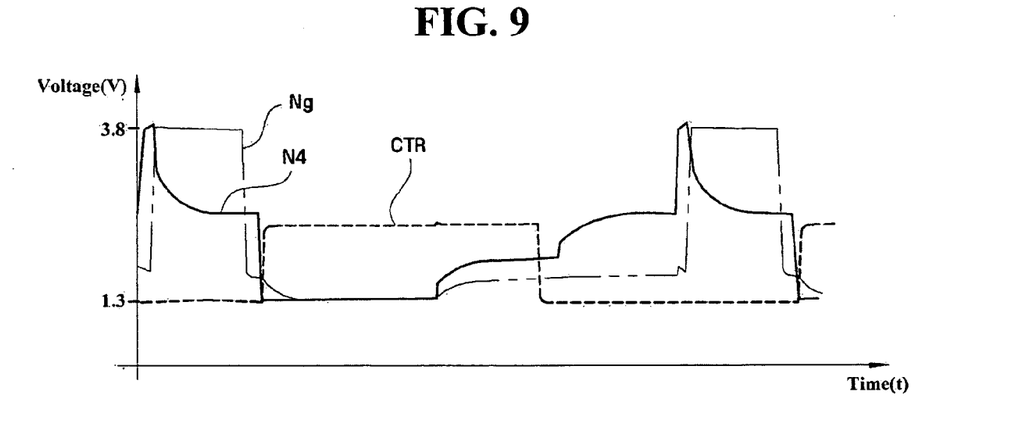
FIG. 9 illustrates a simulation result of a voltage generating circuit for a semiconductor memory device according to an exemplary embodiment of the present invention.

FIG. 9 illustrates a simulation result of a voltage generating circuit for a semiconductor memory device according to an exemplary embodiment of the present invention.

Referring to FIG. 9, after a boosting operation was performed three times, the voltage level of a fourth boosting node N4 was about 3.874V, which was substantially similar to the voltage level of about 3.871V for a gate node Ng of a transfer transistor. The fourth boosting node N4 underwent a voltage drop of about 50 mV, whereas a voltage increment of about 150 mV was achieved at the gate node Ng, compared to when there was no charge sharing between a boosting node and a gate node during a boosting period. This result corresponds to an improvement of about 20% in transfer characteristics under low-voltage conditions (Vcc of 1.3V, Vpp of 2.6V). Such an improvement in transfer characteristics under low-voltage conditions enables a reduction in a transfer time, thereby guaranteeing the operation characteristics of a voltage generating circuit at a short row cycle time (tRC).

According to an exemplary embodiment of the present invention, there is provided a voltage generating method for a semiconductor memory device. The semiconductor memory device of the method includes a multi-boosting unit, a transfer transistor electrically connected to a final boosting node of the multi-boosting unit and an output node, and a charge-sharing element electrically connected to the final boosting node and a gate node of the transfer transistor. The method includes the steps of using the multi-boosting unit to step-up a power supply voltage during a first period, enabling the charge-sharing element during at least a part of the first period, and using the enabled charge-sharing element to perform charge sharing between the final boosting node and the gate node of the transfer transistor during at least a part of the first period.

Those skilled in the art will appreciate that many variations and modifications can be made to the exemplary embodiments without substantially departing from the principles of the present invention. Therefore, the disclosed exemplary embodiments of the invention are used in a generic and descriptive sense only and not for purposes of limitation.

What is claimed is:

1. A voltage generating circuit for a semiconductor memory device, the voltage generating circuit comprising:
   a multi-boosting unit for stepping up a power supply voltage to generate a boosted voltage at a final boosting node of the multi-boosting unit;
   a transfer transistor electrically connected to the final boosting node and an output nodes wherein the boosted voltage is transferred through the transfer transistor to the output node; and
   a charge-sharing element, electrically connected between the final boosting node and a gate node of the transfer transistor, wherein the charge-sharing element is enabled during at least a part of a first period the power supply voltage is stepped-up by the multi-boosting unit, and wherein the charge-sharing element performs charge sharing between the final boosting node and the gate node of the transfer transistor.

2. The voltage generating circuit of claim 1, wherein the charge-sharing element is enabled during the entire first period.

3. The voltage generating circuit of claim 1, wherein the charge-sharing element is an NMOS transistor which is enabled during at least a part of the first period.

4. The voltage generating circuit of claim 3, wherein the multi-boosting unit pre-charges the final boosting node during a second period after the first period, and the charge-sharing element is enabled during the second period.

5. The voltage generating circuit of claim 1, wherein the charge-sharing element is a diode, wherein an anode of the diode is electrically connected to the final boosting node, and a cathode of the diode is electrically connected to the gate node.

6. The voltage generating circuit of claim 1, further comprising a pre-charge element for pre-charging the gate node to a predetermined voltage level.

7. The voltage generating circuit of claim 1, wherein the transfer transistor outputs a voltage at the final boosting node in response to an output signal of a boosted voltage level.

8. The voltage generating circuit of claim 7, further comprising an output boosting capacitor, electrically connected to the gate node and an input terminal of the output signal, the output boosting capacitor pumping charges to the gate node in response to the output signal.

9. The voltage generating circuit of claim 8, wherein the multi-boosting unit comprises a plurality of boosting capacitors for stepping up the power supply voltage, and wherein each of the boosting capacitors has a higher capacitance than the output boosting capacitor.

10. A semiconductor memory device comprising:
    a multi-boosting unit for stepping up a power supply voltage to generate a boosted voltage at a final boosting node of the multi-boosting unit;
    a transfer transistor electrically connected to a final boosting node of the multi-boosting unit and an output node, wherein the boosted voltage is transferred through the transfer transistor to the output node; and
    a charge-sharing element, electrically connected between the final boosting node and a gate node of the transfer transistor, wherein the charge-sharing element is enabled during at least a part of a first period the power supply voltage is stepped-up by the multi-boosting unit, and wherein the charge-sharing element performs charge sharing between the final boosting node and the gate node of the transfer transistor.

11. A voltage generating method for a semiconductor memory device which includes a multi-boosting unit, a transfer transistor electrically connected to a final boosting node of the multi-boosting unit and an output node, a gate node of the transfer transistor being connected to the output node, and a charge-sharing element electrically connected between the final boosting node and a gate node of the transfer transistor, wherein the voltage generating method comprises:

using the multi-boosting unit to step-up a power supply voltage during a first period to generate a boosted voltage;

enabling the charge-sharing element during at least a part of the first period;

using the enabled charge-sharing element to perform charge sharing between the final boosting node and the gate node of the transfer transistor during at least part of the first period; and transferring the boosted voltage through the transfer transistor to the output node.

12. The method of claim 11, wherein the charge-sharing element is enabled during the entire first period.

13. The method of claim 11, wherein the charge-sharing element is an NMOS transistor which is enabled during at least a part of the first period.

14. The method of claim 13, wherein the multi-boosting unit pre-charges the final boosting node during a second period after the first period, and the charge-sharing element is enabled during the second period.

15. The method of claim 11, wherein the charge-sharing element is a diode, wherein an anode of the diode is electrically connected to the final boosting node and a cathode of the diode is electrically connected to the gate node.

16. The method of claim 11, wherein the semiconductor memory device further comprises a pre-charge element for pre-charging the gate node to a predetermined voltage level.

17. The method of claim 11, wherein the transfer transistor outputs a voltage at the final boosting node in response to an output signal of a boosted voltage level.

18. The method of claim 17, wherein the semiconductor memory device further comprises an output boosting capacitor between the gate node and an input terminal of the output signal, wherein the output boosting capacitor pumps charges to the gate node in response to the output signal.

19. The method of claim 18, wherein the multi-boosting unit comprises a plurality of boosting capacitors for stepping up the power supply voltage, and wherein each of the boosting capacitors has a higher capacitance than the output boosting capacitor.

* * * * *